United States Patent [19]

Wolf et al.

[11] Patent Number: 5,575,898

[45] Date of Patent: Nov. 19, 1996

[54] PROCESS FOR THROUGH-HOLE PLATING OF TWO-LAYER PRINTED CIRCUIT BOARDS AND MULTILAYERS

[75] Inventors: Gerhard-Dieter Wolf, Dormagen; Friedrich Jonas, Aachen; Reinhard Schomäcker, Leverkusen, all of Germany

[73] Assignee: Bayer AG, Leverkusen, Germany

[21] Appl. No.: 530,998

[22] Filed: Sep. 20, 1995

[30] Foreign Application Priority Data

Oct. 12, 1994 [DE] Germany ............... 44 36 391.5

[51] Int. Cl.⁶ .............. C25D 5/02; C25D 5/54; C25D 5/56
[52] U.S. Cl. .......... 205/125; 205/159; 205/162; 205/163; 205/164; 205/165; 205/166
[58] Field of Search .................... 205/118, 125, 205/159, 162, 163, 164, 165, 166, 183; 174/266

[56] References Cited

U.S. PATENT DOCUMENTS

| 5,194,313 | 3/1993 | Hupe et al. ................. 216/18 |
| 5,403,467 | 4/1995 | Jonas et al. ................ 205/125 |

FOREIGN PATENT DOCUMENTS

| 0339341 | 11/1989 | European Pat. Off. . |
| 0553671 | 8/1993 | European Pat. Off. . |
| 3927440 | 2/1991 | Germany . |

OTHER PUBLICATIONS

Orbit Abstract of EP 0 553 671 (Aug. 4, 1993).
Orbit Abstract of EP 0 339 341 (Nov. 2, 1989).
Orbit Abstract of DE 39 27 440 (Feb. 28, 1991).

*Primary Examiner*—Arun S. Phasge
*Assistant Examiner*—Edna Wong
*Attorney, Agent, or Firm*—Connolly & Hutz

[57] ABSTRACT

Process for through-hole plating of printed circuit boards and multilayers by applying a conductive layer of a polythiophene onto the walls of the through-holes and electrodeposition of copper onto the walls of the through-holes, characterized in that a microemulsion of a monomeric thiophene of the formula (I) is used to form the conductive polythiophene layer,

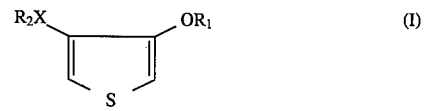

in which
X denotes oxygen or a single bond,
$R_1$ and $R_2$ mutually independently denote hydrogen or a $C_1$–$C_4$ alkyl group or together form an optionally substituted $C_1$–$C_4$ alkylene residue or a 1,2-cyclohexylene residue, and in that the conductive layer of polythiophene is produced on the walls of the through-holes by subsequent or simultaneous treatment with acid and, finally, a metal is electro-deposited on this conductive base.

12 Claims, No Drawings

PROCESS FOR THROUGH-HOLE PLATING OF TWO-LAYER PRINTED CIRCUIT BOARDS AND MULTILAYERS

This invention relates to a process for through-hole plating of two-layer or multi-layer printed circuit boards using polythiophenes to provide a conductive layer to the through-holes for direct electrochemical metal deposition. A particular feature of the invention is the use of microemulsions of specific thiophenes which are polymerized in the drilled holes to yield the conductive polythiophene layers.

Processes for the through-hole plating of printed circuit boards with copper laminated on both sides, for example those based on glass-fiber reinforced epoxy resins, are known (c.f. Herrmann, Handbuch der Leiterplatten-technik, Eugen G. Leuze Verlag, Saulgau). In general, the walls of the through-holes in the printed circuit boards are coated with metals, preferably copper, using per se known processes in electroless metallizing baths and electrically conductive connections are thus produced between the top and bottom of the printed circuit boards. In general, these conductive connections are reinforced by the electrodeposition of copper from copper baths.

In recent times, processes in which instead of using electroless copper baths, copper is directly applied by electrodeposition onto the walls of drilled holes in printed circuit boards (direct plating) have assumed increased significance. It is necessary to this end to provide the walls of the drilled holes with an electrically conductive coating prior to electrodeposition of the copper. It must be possible to apply this coating uniformly and it must moreover be sufficiently electrically conductive to serve as the basis for satisfactory electrodeposition of copper on the whole wall surface (through-hole plating). DE-PS 3 806 884 and DE-OS 3 927 440 describe the use of polypyrrole as a conductive coating in the through-holes for the electrodeposition of copper. The production processes demand the following steps:

1. Production of through-holes in the copper-laminated boards (base materials)
2. Oxidative pretreatment of the holes, for example with alkaline potassium permanganate solution
3. Rinsing with water
4. Treatment with a pyrrole solution
5. Treatment with an aqueous acid to initiate polymerization of the pyrrole to yield conductive polypyrrole coating in the hole
6. Rinsing with water
7. Electrodeposition of copper.

When the process is performed in practice, it has been found that the pyrrole applied in step 4 to the wall of the drilled hole and onto the surface of the printed circuit board does not polymerize solely on the walls of the drilled hole, in accordance with the purposes of the process to produce the conductive coating, when it is immersed in the bath containing acid in stage 5, but considerable quantities are also dissolved off and polymerize "uncontrollably" in the acid bath itself. This results in the formation of polypyrrole sludge which must repeatedly be removed from bath 5.

There is also the risk that, due to its low vapor pressure, pyrrole will be dispersed within the production facility and will polymerize wherever there is acid or acid vapor.

A process is also known (from DE-OS 4 202 337) for the production of through-plated printed circuit boards and multilayers in which, by treatment with a solution or emulsion of a thiophene of the general formula (I)

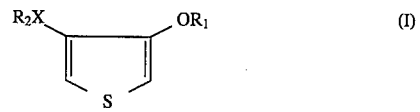

in which
X denotes oxygen or a single bond,
$R_1$ and $R_2$ mutually independently denote hydrogen or a $C_1$–$C_4$ alkyl group or together form an optionally substituted $C_1$–$C_4$ alkylene residue, preferably a methylene residue optionally substituted by alkyl groups, a 1,2-ethylene residue optionally substituted by $C_1$–$C_{12}$ alkyl or phenyl groups, a 1,3-propylene residue or a 1,2-cyclohexylene residue,
and simultaneous or subsequent treatment with an aqueous acid, a conductive layer of a corresponding polythiophene is produced on the walls of the drilled holes and a metal is electrochemically deposited onto this layer.

It has, however, been found that good, reproducible results may be achieved only if the concentration of the polythiophenes in the solution is at least 3 to 5%. In view of the complicated structure of the thiophenes to be used, this elevated concentration is neither technically nor economically viable.

If the thiophenes are used as an emulsion, satisfactory results are achieved, even on an industrial scale, at thiophene concentrations of as low as 1% to 1.5%. The disadvantage of the emulsions is, however, their limited stability. Purification processes, such as filtration, subject the emulsions to shear forces, which still further reduce emulsion stability.

The present invention provides a process for through-hole plating of printed circuit boards and multilayers by applying a conductive layer of a polythiophene onto the walls of the through-holes and electrodeposition of copper onto the walls of the drilled holes, which process is characterized in that a microemulsion of a monomeric thiophene of the formula (I) is used to form the conductive polythiophene layer,

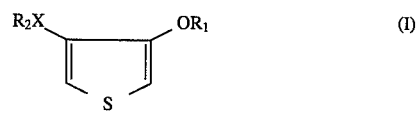

in which
X denotes oxygen or a single bond,
$R_1$ and $R_2$ mutually independently denote hydrogen or a $C_1$–$C_4$ alkyl group or together form an optionally substituted $C_1$–$C_4$ alkylene residue or a 1,2-cyclohexylene residue,
and in that the conductive layer of polythiophene is produced on the walls of the through-holes by subsequent or simultaneous treatment with acid and, finally, a metal is electro-deposited on this conductive base.

The invention accordingly provides a process comprising the following process steps:
a) Production of through-holes in the copper-laminated boards (base materials) and multilayers
b) Oxidative pretreatment of the drilled holes
c) Rinsing with water
d) Treatment with a microemulsion of a thiophene of the formula (I)
e) Treatment with an acid
f) Rinsing with water
g) Electrodeposition of copper.

Steps d) and e) may be combined into a single step by using a microemulsion of a thiophene and an acid. In this manner, the process is advantageously shortened by one step. However, the stability of the microemulsion is then no longer so high, for which reason it is finally recommended to perform the two steps d) treatment with a microemulsion of a thiophene of the formula (I)

and e) treatment with an acid separately.

Steps a), b), c), f) and g) correspond to the prior art and are performed in a manner known per se. However, in step b), potassium permanganate in an alkaline medium is preferably used. It has proved particularly advantageous to use a 4–8% potassium permanganate solution with a pH value of between 8 and 10, wherein acceptable results may also be achieved with other concentrations and pH values of the potassium permanganate solutions.

In step d) according to the invention, microemulsions of a monomer of the formula (I) are used:

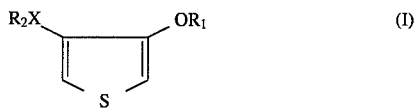

in which

X denotes oxygen or a single bond, $R_1$ and $R_2$ mutually independently denote hydrogen or a $C_1$–$C_4$ alkyl group or together form an optionally substituted $C_1$–$C_4$ alkylene residue; preferably a methylene residue optionally substituted by alkyl groups, a 1,2-ethylene residue optionally substituted by $C_1$–$C_{12}$ alkyl or phenyl groups, a 1,3-propylene residue or a 1,2-cyclohexylene residue, In the formula (I), $R_1$ and $R_2$ together preferably constitute 1,2-alkylene residues derived from 1,2-dibromoalkanes, as may be obtained on bromination of α-olefins, such as ethene, 1-propene, 1-hexene, 1-octene, 1-decene, 1-dodecene and styrene; or 1,2-cyclohexylene, 2,3-butylene, 2,3-dimethyl-2,3-butylene and 2,3-pentylene.

The methylene, 1,2-ethylene and 1,3-propylene residues are particularly preferred; the 3,4-ethylenedioxithiophene of the formula (II) is particularly preferred

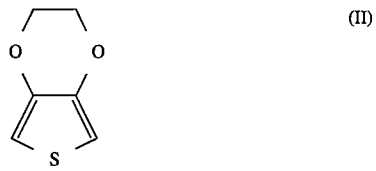

According to the invention, microemulsions of the selected thiophenes are used in step d). These are extraordinarily stable, ensure a very long service life despite continuous purification processes, for example filtration through filter cartridges, and allow the thiophene to be used in a technically and economically viable low concentration of only 0.5 to 1.5%.

Microemulsions are known per se. They essentially differ from conventional emulsions by having substantially smaller droplets of 5 to 100 nm in diameter. (Droplet diameter of conventional emulsions: 0.5 to 10 μm). The microemulsions are optically transparent and thermodynamically stable, i.e. even after extended periods, the microemulsions do not separate into two phases [Angewandte Chemie 1985, 97, 655].

The droplet diameter of the microemulsion is established in the range from 5 to 100 nm as a function of its composition and is independent of energy input (mixing operation) with which dispersion is performed.

Since droplet size is far below the wavelength of visible light, the microemulsion is optically transparent, like a solution, although droplets are present, as in an emulsion. While mechanical energy must be used to produce an emulsion, a microemulsion is formed spontaneously from the components by gentle stirring. This production process for the microemulsion is comparable with mixing two miscible liquids.

The precondition for the described formation of the microemulsion is that the composition and temperature of the mixture are within the single-phase zone of the phase diagram of the system concerned. Each ternary mixture of water, thiophene of the general formula (I) and a surfactant has its own phase diagram. In these various diagrams, the single-phase zone is found in each case at different temperatures and compositions. The temperature range of the single-phase zone is determined by the hydrophilicity of the surfactant, i.e. it is displaced towards higher temperatures as hydrophilicity increases. The temperature range of the single-phase zone may be adjusted to a desired temperature by using surfactant mixtures.

The surfactant (or surfactant mixture) selected for the application was that with which the single-phase zone extended over the desired compositions and the desired temperature range. Two-phase zones, in which normal emulsions of the mixture of water, thiophene of the general formula (I) and surfactant occur, border on the single-phase zone.

Ionic and non-ionic surfactants are suitable for the production of the microemulsion. A single surfactant or a mixture of two or three surfactants may be used.

The following may specifically be cited: n-alkyl($C_8$–$C_{18}$) sulphonates, n-alkyl($C_8$–$C_{18}$)benzene sulphonates, n-alkyl ($C_8$–$C_{18}$) trimethylammonium salts, n-dialkyl($C_8$–$C_{18}$) dimethylammonium salts, n-alkyl($C_8$–$C_{18}$) carboxylates, oligoethylene oxide mono-n-alkyl ethers ($C_{6-18}EO_{2-30}$), n-alkyl ($C_8$–$C_{18}$) dimethylamine oxide, n-alkyl($C_8$–$C_{18}$) dimethylphosphine oxide or oligoethylene oxide mono-n-arylethers. The n-alkyl chains may also be replaced by partially unsaturated chains.

It is preferred for performance of the process according to the invention to add a surfactant from the group of the oligoethylene oxide mono-aryl ethers. Surfactants of the group $PS_{2-5}EO_{10-50}$ of the formula (III) are particularly preferred, $PS_{2.8}EO_{29}$ of the formula (IV) is very particularly preferred

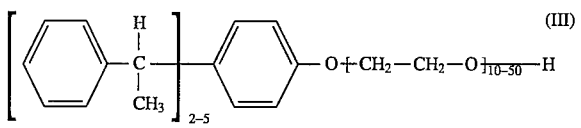

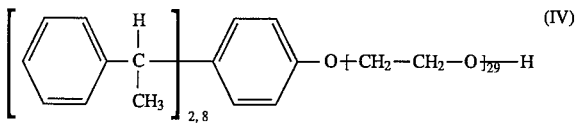

In order to optimize the stability of the microemulsion, it is optionally possible to add alcohols (such as for example ethanol, propanol, butanol, hexanol, heptanol, octanol or decanol), salts (such as for example sodium sulphate, potassium sulphate or similar) or acids (such as for example sulphuric acid) to the water or to the concentrate.

Microemulsions of the thiophene of the formula (II), 3,4-ethylenedioxithiophene, hereinafter EDT, are particularly preferred.

A microemulsion of EDT is preferably produced by introducing a concentrate prepared from the EDT and the surfactant into water and thoroughly mixing.

The composition of the concentrate is
10 to 90 wt. % EDT and
10 to 90 wt. % surfactant,
a preferred composition is
30 to 70 wt. % EDT and
30 to 70 wt. % surfactant,
a particularly preferred composition is
60 wt. % EDT and
40 wt. % surfactant.

In order to produce the microemulsion, 0.1 to 10 wt. % of this concentrate are introduced into water. A preferred quantity is 0.5 to 3 wt. %, particularly preferably 1 to 2.5 wt. %.

Compositions containing 0.5 to 1.5 wt. % of EDT are particularly preferably used.

Naturally, the components EDT and surfactant may be separately added in the stated quantities to the water, wherein the microemulsion may be produced by subsequent stirring.

As already described, those microemulsions are particularly preferred which contain the EDT in a concentration of 0.5 to 1.5 wt. %.

The advantages of a microemulsion to be used according to the invention are again summarized below.

The microemulsion offers advantages in comparison with hitherto used emulsions as it is formed spontaneously from water and the concentrate with gentle stirring, whereas for a normal emulsion a defined, generally high, energy input is required. Even over extended periods of storage, there are no changes in composition caused by phase separation, as is the case with normal emulsions. Optical transparency allows simple evaluation of the stability of the system against chemical ageing by visual inspection.

The printed circuit boards are treated with the microemulsion preferably at temperatures of 0° to 90° C., particularly preferably at 15° to 50° C. The duration of treatment is between 1 second and two or more minutes, preferably between 5 seconds and 2 minutes.

The following may be used according to the invention as the acid component e):

Polymeric polysulphonic acids, for example polystyrene polysulphonic acid or polyvinyl polysulphonic acids or copolymers of these acids with other monomers containing no acid groups. Polystyrene polysulphonic acid with a degree of sulphonation of approximately 90% in an aqueous solution with a concentration of 0.5 and 5% is preferred, particularly preferably of 1 and 2.5%.

Strong inorganic acids with an elevated acid concentration, for example 20 to 30% sulphuric acid or 25 to 50% phosphoric acid.

Strong inorganic acids combined with water-soluble polymers. Inorganic acids which may be cited are: sulphuric, phosphoric and hydrochloric acid. Examples of water-soluble polymers are: polyvinyl alcohol, polyvinyl pyrrolidone, polyacrylic acid, polystyrene polysulphonic acid and copolymers with other monomers, provided that the copolymers remain water-soluble.

The water-soluble polymers are added at concentrations of 0.1 to 10%, preferably at concentrations of 0.5 to 2.5%, to the strong inorganic acids, which are preferably adjusted to a concentration of 10 to 20%.

Examples of these mixtures are: 1.5% of polyvinyl alcohol in 20% sulphuric acid or 0.5% of polystyrene polysulphonic acid in 15% sulphuric acid or 1.0% of polyvinyl alcohol in 20% phosphoric acid.

The composition of the acid component e) is of great significance to the complete success of the through-hole plating using the described EDT microemulsions.

The process according to the invention for the production of through-hole plated two-layer printed circuit boards and multilayers using polythiophene as a conductive layer on the walls of the through-holes for direct electrochemical metal deposition may be performed on any hitherto known printed circuit board base materials. The following copper-laminated, phenolic resin/glass cloth laminates are preferably used, wherein particularly good results are achieved with epoxy resin/glass cloths.

The process may be performed in containers and devices conventional for through-hole plating; through-hole plating using the horizontal technique is preferred, in particular if particularly thin holes or those with an unfavorable length/cross-section ratio (such as for example in multilayers) are to be through-hole plated.

EXAMPLES

EXAMPLE 1

Production of microemulsion: 12 g of surfactant $PS_{2.8}EO_{29}$ are dissolved in 978 g of deionized water. 10 g of 3,4-ethylenedioxithiophene are then stirred in. A clear, slightly yellowish liquid is produced.

A printed circuit board made from epoxy resin/glass cloth and copper-laminated on both sides is provided with drilled holes. The board is then kept in motion for 3 minutes at 90° C. in a solution prepared from 6 g of potassium permanganate in 100 ml of water and adjusted to a pH value of 9.5 with sodium hydroxide. The board is then rinsed with water until the water runs off colorless. The board is then immersed in the above-described microemulsion for 1 minute at room temperature and then transferred, without rinsing, into a solution of 18 g of polystyrene sulphonic acid in 982 g of water. The solution is at room temperature; the residence time is 1 minute. The board is then again thoroughly rinsed with water.

In order to copper plate the drilled holes, the board is fixed into an electroplating frame and electroplated for 10 minutes at a voltage of approximately 4 $A/dm^2$ in an electroplating copper bath (Cupracid 210 from Schering) in order to produce a void-free copper coating with good adhesion.

EXAMPLE 2

As described in example 1, a copper-laminated printed circuit board is pretreated with a potassium permanganate solution and rinsed with water.

The board is then immersed in the microemulsion according to example 1 for one minute and then transferred, without rinsing, into an acid solution which was prepared by dissolving 18 g of Moviol (polyvinyl alcohol from Hoechst) in one liter of 20% sulphuric acid. The residence time was 2 minutes (room temperature). After rinsing in water, the board was copper plated as described in example 1. This treatment took approximately 8 minutes until the drilled holes were completely covered with copper (current density 4–5 $A/dm^2$). The through-hole plated printed circuit board produced in this manner was further electroplated with copper to a thickness of 25 μm. The board passed the thermal shock test conventionally used in the printed circuit board industry without any problem.

EXAMPLE 3

The same procedure was used as in example 1, wherein a microemulsion was used which was prepared from 6 g of $PS_{2.8}EO_{29}$, 6 g of $PS_{2.8}EO_{16}$, 12 g of 3,4-ethylenedioxithiophene and 976 g of deionized water.

Equally good results as in examples 1 and 2 were obtained. After 8 minutes' metallization under the stated conditions, the drilled holes had been completely covered with a copper layer with good adhesion and, after application of a copper layer of 25 μm in thickness, the thermal shock test conventionally used in the printed circuit board sector was performed and passed without any problem.

EXAMPLE 4

A copper-laminated printed circuit board made from epoxy resin/glass cloth is provided with drilled holes 0.8 mm in width. In order to achieve through-hole plating, the board is kept in motion for 2 to 3 minutes at 90° C. in a solution of 7 g of potassium permanganate in 100 ml water with a pH value of 9.2. The board is then rinsed with water until the water runs off colorless. The board is then immersed for 2 minutes at room temperature in the microemulsion described in example 3 and is then transferred, without intermediate rinsing, into a 30% aqueous sulphuric acid. The residence time in the sulphuric acid at room temperature was one minute. The board is then thoroughly rinsed with water.

For the purpose of copper plating, the board is fixed into an electroplating frame and electroplated for 10 minutes at a voltage of 3 A/dm$^2$ in an electroplating copper bath from the company Blasberg Oberflächentechnik (LP 1) in order to produce a void-free copper coating with good adhesion.

EXAMPLE 5

As described in example 4, a copper-laminated printed circuit board is pretreated with a potassium permanganate solution and thoroughly rinsed with water.

The board is then immersed for 1 minute in the microemulsion according to example 1 and then transferred, without rinsing, into an acid solution which was produced by dissolving 25 g of polyvinyl pyrrolidone in one liter of 15% sulphuric acid. The residence time was 2 minutes at room temperature. After rinsing in water, copper plating is performed as described in example 1. This treatment lasts 6 to 8 minutes until the drilled holes were completely covered with a copper coating (current density 3 to 4 A/dm$^2$). The through-hole plated printed circuit board produced in this manner was further electroplated with copper to a thickness of 25 μm. The board passed the thermal shock test conventionally used in the printed circuit board industry without any problem.

We claim:

1. Process for through-hole plating of printed circuit boards and multilayers by applying a conductive layer of a polythiophene onto the walls of the through-holes and electrodeposition of copper onto the walls of the through-holes, comprising the use of a microemulsion of a monomeric thiophene of the formula (I) to form the conductive polythiophene layer,

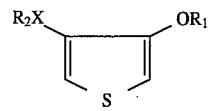

in which

X denotes oxygen or a single bond,

R$_1$ and R$_2$ mutually independently denote hydrogen or a C$_1$–C$_4$ alkyl group or together form an optionally substituted C$_1$–C$_4$ alkylene residue or a 1,2-cyclohexylene residue, wherein the conductive layer of polythiophene is produced on the walls of the through-holes by subsequent or simultaneous treatment with acid and, finally, a metal is electro-deposited on this conductive layer.

2. Process according to claim 1 comprising the following process steps:

a) Production of through-holes in the printed circuit boards and multilayers;

b) Oxidative pretreatment of the through-holes;

c) Rinsing with water;

d) Treatment with a microemulsion of a thiophene of the formula (I);

e) Treatment with an acid;

f) Rinsing with water and;

g) Electrodeposition of copper.

3. Process according to claim 2, wherein the oxidative pretreatment (b) is performed with alkali metal permanganate to form a manganese dioxide layer.

4. Process according to claim 2, wherein a polymeric polysulphonic acid is used as the acid (e).

5. Process according to claim 2, wherein a strong aqueous inorganic acid combined with a polymer is used as the acid (e).

6. Process according to claim 2, wherein an aqueous solution of a strong inorganic acid but with a minimum concentration of 10% is used as the acid (e).

7. Process according to claim 2, wherein 15 to 20% sulphuric acid is used as the acid (e).

8. Process according to claim 2, wherein 30 to 50% phosphoric acid is used as the acid (e).

9. Process according to claim 2, wherein process steps (d) and (e) are combined into a single step.

10. Process according to claim 1, wherein 3,4-ethylenedioxithiophene is used as the thiophene of the formula (I).

11. Process according to claim 1, wherein said printed circuit board is a two-layer printed circuit board with copper laminated on both sides of a base material.

12. Process according to claim 1, wherein said multilayer is a multi-layer printed circuit board with copper laminated on the top and bottom sides of the board.

* * * * *